United States Patent
Gris et al.

[11] Patent Number: 5,970,333
[45] Date of Patent: Oct. 19, 1999

[54] DIELECTRIC ISOLATION BIPOLAR TRANSISTOR

[75] Inventors: Yvon Gris, Tullins; Jocelyne Mourier, Saint Egreve; Germaine Troillard, Grenoble, all of France

[73] Assignee: SGS-Thomson Microelectronics S.A., Saint Genis, France

[21] Appl. No.: 08/997,199

[22] Filed: Dec. 23, 1997

[30]     Foreign Application Priority Data

Dec. 27, 1996 [FR]  France .................................. 96 16337

[51] Int. Cl.⁶ ................................................ H01L 21/8238
[52] U.S. Cl. ........................ 438/207; 438/202; 438/234; 438/361; 438/154
[58] Field of Search ................................. 438/207, 202, 438/199, 234, 154, 155, 361

[56]           References Cited

U.S. PATENT DOCUMENTS

| | | | |
|---|---|---|---|
| 4,958,213 | 9/1990 | Eklund et al. | 257/378 |
| 5,047,357 | 9/1991 | Eklund | 438/207 |
| 5,089,429 | 2/1992 | Hsu | 438/207 |
| 5,171,702 | 12/1992 | Prengle et al. | 438/207 |
| 5,471,083 | 11/1995 | Ikeda et al. | 257/370 |
| 5,547,893 | 8/1996 | Sung | 438/207 |

FOREIGN PATENT DOCUMENTS

| | | | |
|---|---|---|---|
| 0 495 329 | 7/1992 | European Pat. Off. | H01L 21/82 |
| 0 746 032 | 12/1996 | European Pat. Off. | H01L 27/06 |

OTHER PUBLICATIONS

French Preliminary Search Report for application No. 9616337, filed Dec. 27, 1996.

Primary Examiner—Carl Whitehead, Jr.
Assistant Examiner—Khanh Duong
Attorney, Agent, or Firm—Wolf, Greenfield & Sacks, P.C.

[57]              ABSTRACT

The present invention relates to a method of forming deep trenches in a BICMOS-type integrated circuit wherein the formation of a bipolar transistor includes the steps of depositing a base polysilicon layer, depositing a protection oxide layer, forming an emitter-base opening, and etching the silicon oxide protection layer and the base polysilicon layer outside the bipolar transistor areas. The formation of the trenches includes the steps of opening the protection oxide and base polysilicon layers above a thick oxide region while the emitter-base opening is being made, etching the thick oxide layer while the protection oxide layer is being etched, and etching the silicon under the thick oxide while the base polysilicon is being etched.

12 Claims, 8 Drawing Sheets

5,970,333

DIELECTRIC ISOLATION BIPOLAR TRANSISTOR

BACKGROUND OF THE INVENTION

1. Field of the Invention

The present invention relates to a line of manufacturing of integrated circuits containing, in particular, bipolar and complementary MOS (CMOS) components. This type of line is usually called a BICMOS line.

SUMMARY OF THE INVENTION

An object of the present invention is to provide such a line wherein the dimensions of an element patterned on a mask can be lower than 0.4 μm, for example, 0.2 to 0.35 μm.

A more specific object of the present invention is to provide such a line wherein primary components can be isolated from one another by trenches filled with dielectric.

To achieve these and other objects, the present invention provides a method of forming of deep trenches in a BICMOS-type integrated circuit wherein the formation of a bipolar transistor includes the steps of depositing a base polysilicon layer; depositing a protection oxide layer; forming an emitter-base opening; depositing an emitter polysilicon layer and etching this layer; etching the silicon oxide protection layer and the base polysilicon layer outside the areas of the bipolar transistor. For the formation of the trenches, this method includes the steps of opening the protection oxide and base polysilicon layers above a thick oxide region while the emitter-base opening is being made; etching the thick oxide layer while the protection oxide layer is being etched; and etching the silicon under the thick oxide while the base polysilicon is being etched.

According to an embodiment of the present invention, the smaller of the masks for defining the trench is that which corresponds to the opening of the protection oxide and base polysilicon layers.

According to an embodiment of the present invention, the method includes, prior to the opening of the protection oxide and base polysilicon layers, a step of removal of the apparent silicon nitride layers.

According to an embodiment of the present invention, the trench has a depth of about 1 to 1.5 μm.

According to an embodiment of the present invention, the trench has a width of 0.25 to 0.50 μm.

The foregoing objects, characteristics and advantages of the present invention will be discussed in detail in the following non-limiting description of specific embodiments, in connection with the accompanying drawings.

DETAILED DESCRIPTION

Figure 1:
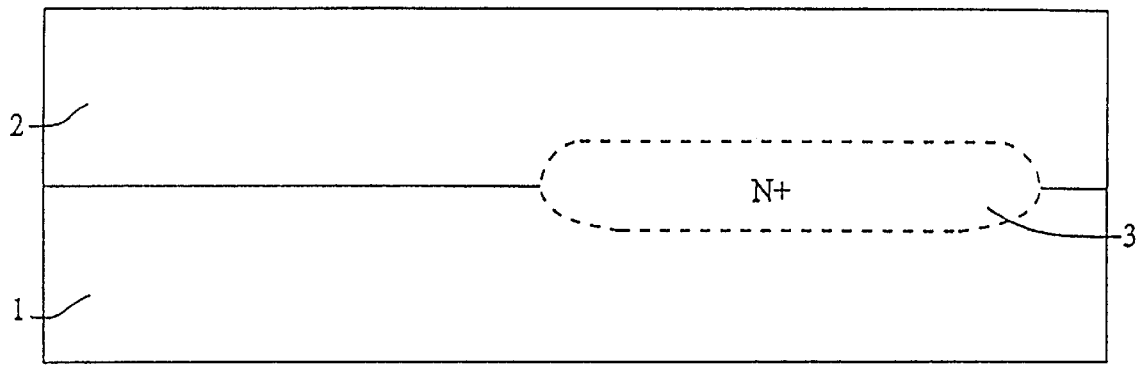
FIGS. 1 to 11 are simplified cross-sectional views illustrating successive steps of fabrication of an embodiment of an N-channel MOS transistor, of a P-channel MOS transistor, and of an NPN-type bipolar transistor.

As usual in the field of the representation of semiconductor components, the several cross-sectional views are not drawn to scale. The lateral and crosswise dimensions of the several layers and regions are arbitrarily expanded or reduced to facilitate the drawing.

Generally in the following description, the left side of FIGS. 1 to 11 in which a CMOS component is formed will be designated as the CMOS side and the right side of the drawings in which an NPN-type bipolar transistor is formed will be designated as the bipolar side. In the following, the manufacturing of an N-channel MOS transistor, of a P-channel MOS transistor, and of an NPN-type bipolar transistor will be described. Of course, in a practical implementation, many identical components, as well as possibly other types of primary components, will be formed simultaneously.

According to an aspect of the present invention, the initial steps correspond to known steps of fabrication of CMOS integrated circuits of very small dimensions (minimum dimension, or gate dimension, lower than 0.35 μm).

As shown in FIG. 1, a P-type substrate 1 is used to start with, and an N-type epitaxial layer 2 is formed thereon. This epitaxial layer is relatively thin, for example of a thickness on the order of 1 to 1.2 μm.

Before growth of the epitaxial layer, buried layers of appropriate types are provided, if desired, in the areas where N or P wells of CMOS transistors are to be formed and an N$^+$-type buried layer 3 is provided on the bipolar side.

Figure 2:
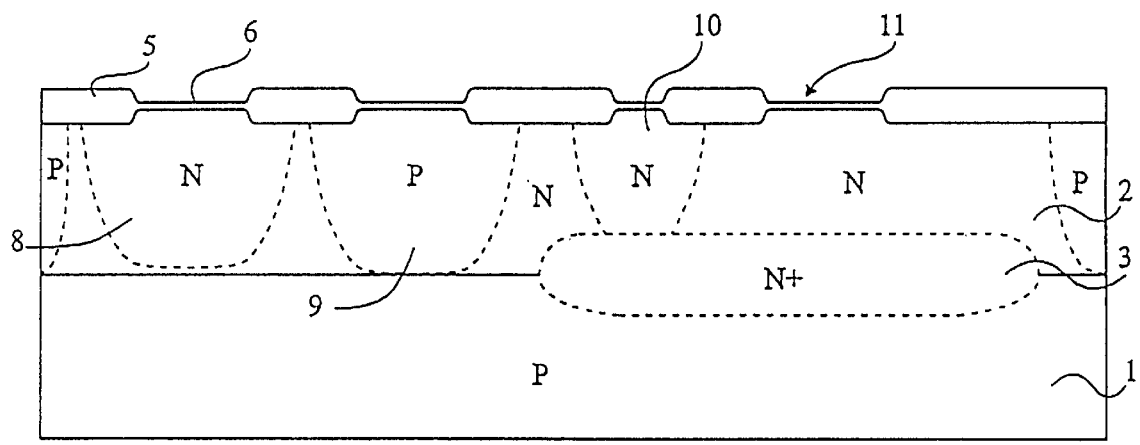

As shown in FIG. 2, on the CMOS side, the MOS transistor regions are delimited by openings in a thick oxide layer 5 formed by any known technique. N-type wells 8 and P-type wells 9 are conventionally implanted through the thick oxide or a thin oxide region 6 formed in the openings. These wells are for example formed by a succession of three implantations, one of which reaches through thick oxide 5 in unmasked regions. These N and P channels are respectively meant for P-channel MOS transistors and N-channel MOS transistors. The surface doping level (some $10^{16}$ at./cm$^3$) determines the threshold voltage of the transistors. In the general case, the P wells (associated with a P$^+$ buried layer) are in electrical contact with the P substrate. It could be, however, provided to form some at least of the P wells on an N-type buried layer. The N wells are completely isolated since they emerge in substrate P and they are laterally isolated by P regions formed like the P wells.

Simultaneously, on the bipolar side, a region in which a collector contact recovery drive-in or collector well 10 joining buried layer 3 will be formed is defined in thick oxide 5. This collector well is formed by at least some of the implantations made to form N-type well 8, or by a specific N$^{30}$-type implantation. This collector well can also be formed subsequently at the same time as the sources and drains of the N-channel MOS transistors. Also, an area 11 where the base and emitter of an NPN-type bipolar transistor will be formed is defined in the thick oxide. During the several implantations of N and P wells, this area 11 is masked.

Figure 3:
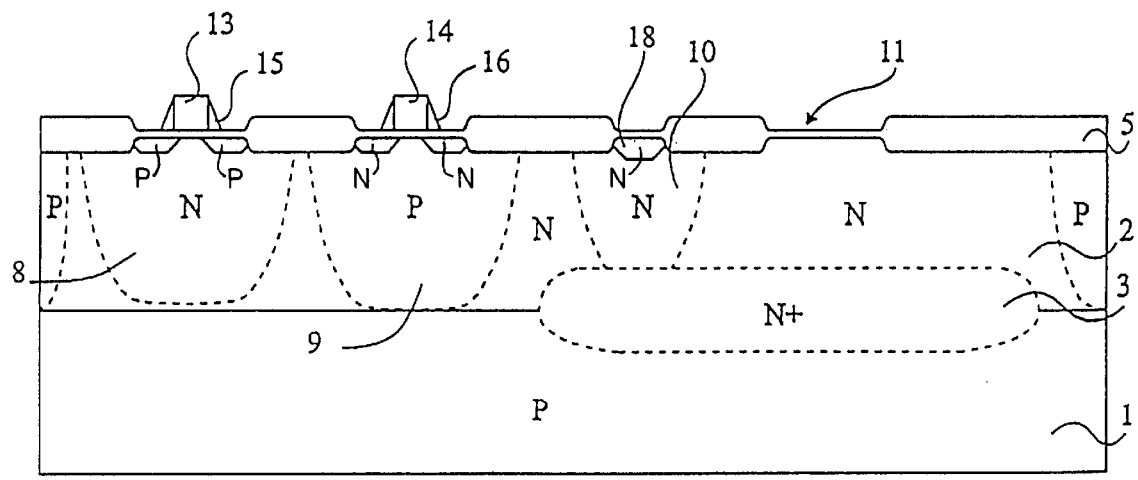

As shown in FIG. 3, on the MOS side, isolated gates 13 and 14 of the MOS transistors are conventionally formed; first implantations (LDD) are made; spacers 15 and 16 are formed; and drain and source implantations are made. In well 8, the implantations are of type P and, in well 9, the implantations are of type N. While the source and drain implantations of the N-channel transistors in the P wells are being made, a heavily doped N-type diffusion 18 is performed at the surface of collector well 10 to improve the subsequent linkup.

A fast thermal anneal is then performed (1025° C.).

After this step, at the end of which most of the MOS transistors has been made (except for the possible linkup silicidations and the metallizations), the implementation of the NPN-type bipolar transistor is started.

Figure 4:
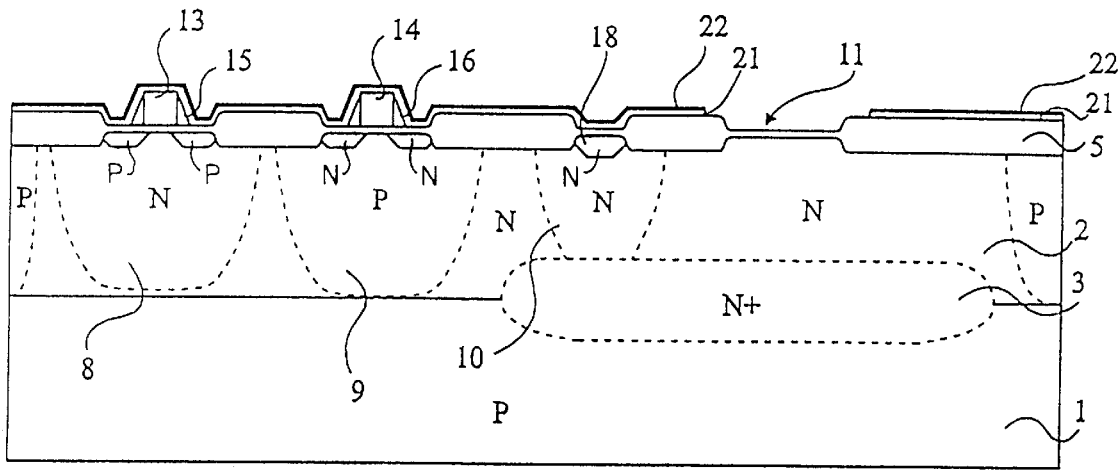

At the step illustrated in FIG. 4, a double protection layer including a silicon oxide layer 21 having, for example, a thickness of about 20 nm followed by a silicon nitride layer 22 having for example a thickness of about 30 nm is deposited over the entire structure, by chemical vapor deposition. This layer 21-22 is opened in the area 11 where it is desired to form the emitter-base region of a bipolar transistor. It should be noted that this opening is not critical since it stops on thick oxide regions.

Figure 5:
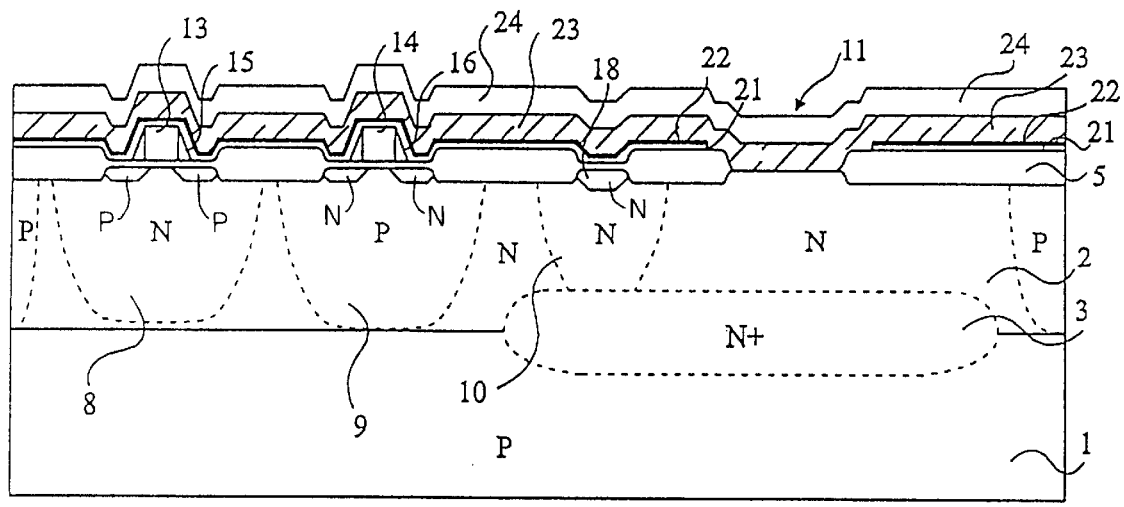

At the step illustrated in FIG. 5, a silicon layer 23 having, for example, a thickness of about 200 nm followed by an encapsulation oxide layer 24 having, for example, a thickness of about 300 nm is deposited over the entire structure.

Silicon layer 23 must be P-type doped since it will be used, as will be seen hereafter, as a doping source for the extrinsic base of the NPN transistor and will be called base polysilicon. Although called polysilicon, it can also be any type of deposited silicon layer, for example amorphous silicon. Preferably, according to an aspect of the present invention, a layer 23 of polysilicon or undoped amorphous silicon is first deposited, after which a P-type doping is implanted in this layer. Preferably, boron is implanted in the form of $BF_2$ at very high dose ($10^{15}$ to $10^{16}$ at./cm$^2$) and low energy so that the implanted boron concentrates in the upper part of the layer, avoiding boron implantation in the underlying silicon substrate in region 11.

Figure 6:
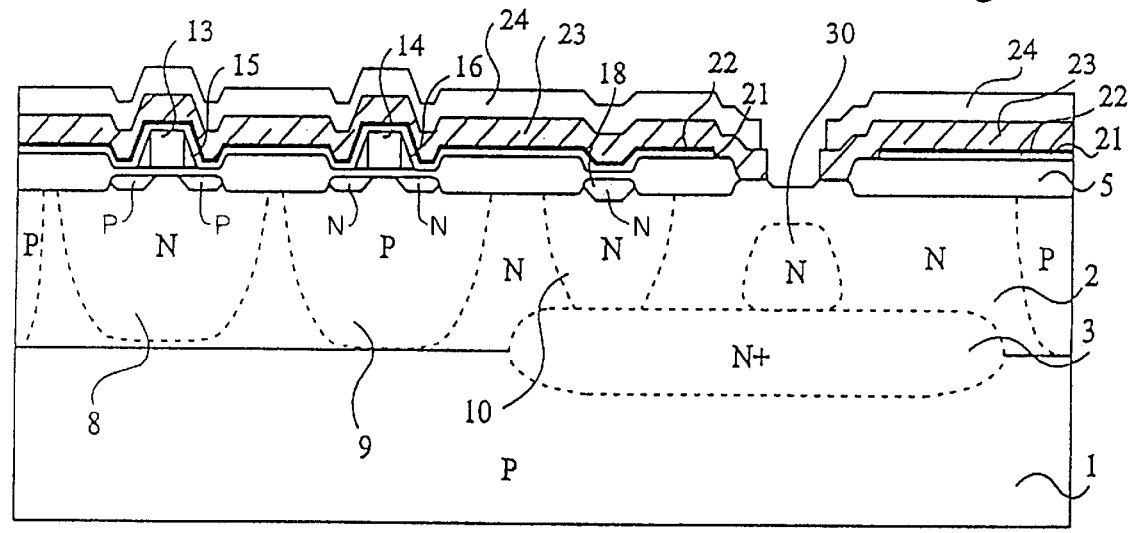

At the step illustrated in FIG. 6, an opening is provided in layers 24 and 23 in the central part of region 11. This opening has, for example, a width included between 0.4 and 0.8 $\mu$m and penetrates into the single crystal silicon by less than 50 nm. An N-type doping is then implanted to define collector 30 of the NPN transistor. This collector is thus self-aligned on the opening. The N implantation is performed at medium dose and high energy (for example, $10^{12}$ to $10^{14}$ at./cm$^2$ under 500 keV). An effective collector region of limited lateral extension, substantially equal to that of the intrinsic base formed afterwards is thus obtained. This contributes to obtaining an NPN transistor having low stray capacitance between collector and extrinsic base. The implantation is optimized (for example, by successive implantations) so that the collector profile provides the best possible compromise between, on the one hand, the collector resistance and the time of transit through this collector and, on the other hand, obtaining sufficiently high emitter-collector and basecollector breakdown voltages (typically 4 volts) and of a low base-collector capacitance. It should also be noted that this collector implantation enables to previously choose an epitaxial layer 2 having a doping and thickness suitable to optimize the CMOS transistors and then independently optimize the characteristics of the NPN transistors. Especially, this epitaxial layer can be thicker than if it had to be directly used as a collector layer of the NPN transistor.

Figure 7:
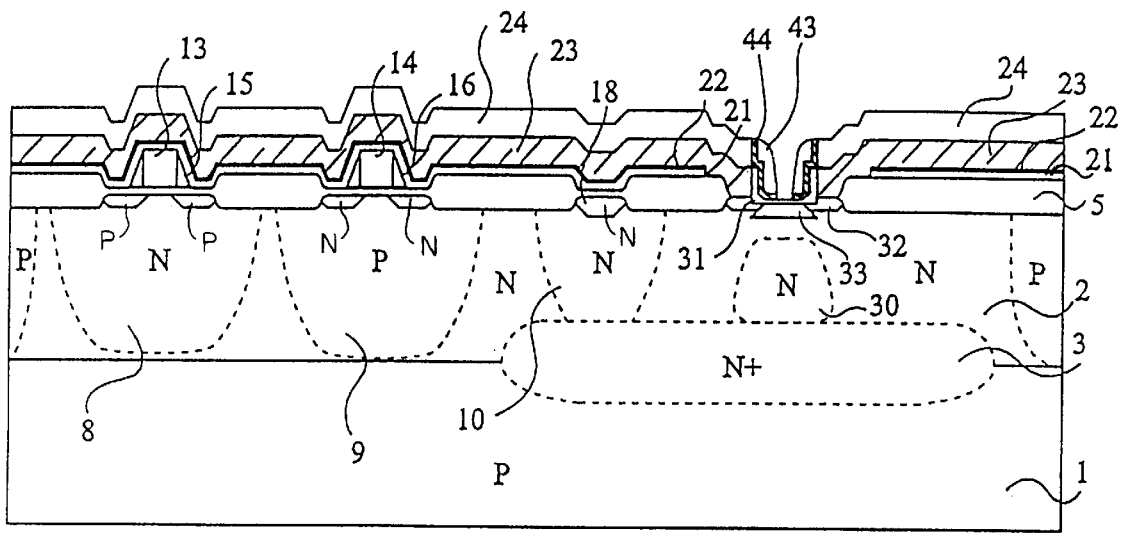

As shown in FIG. 7, after removal of the masking resist, a thermal oxidation is performed, during which a thin thermal oxide layer 31 of a thickness on the order of 5 to 10 nm forms and during which the boron contained in polysilicon layer 23 starts diffusing into the underlying epitaxial layer to form extrinsic base region 32 having, for example, a junction depth of about 100 nm. This diffusion is then completed with the final annealing of the bipolar structure. A P-type implantation is then performed through oxide 31 to form an intrinsic base region 33 at the center of the opening in layers 23 and 24. This intrinsic base is preferably implanted with low energy boron (for example, $10^{13}$ at./cm$^2$ under 5 keV). The contact with polysilicon 23 results from the lateral diffusion of the boron of the polysilicon.

A uniform deposition of a thin silicon nitride layer (30 nm) coated with a polysilicon layer (100 nm) is then performed. The polysilicon layer is then etched anisotropically so that there only remains spacers 43 on the sides of the opening made in layers 23 and 24. A uniform etching of the silicon nitride is then performed, so that this silicon nitride remains in place only in the regions 44 where it is protected from the etching (chemical or plasma etching) by polysilicon spacers 43. Nitride 44 and spacers 43 thus altogether define a smaller opening than the opening initially formed in layers 23 and 24 for the definition of the intrinsic base. This smaller opening is the emitter opening. If the spacers have a width of about 150 nm each, this small opening has a width of about 0.5 $\mu$m.

Figure 8:
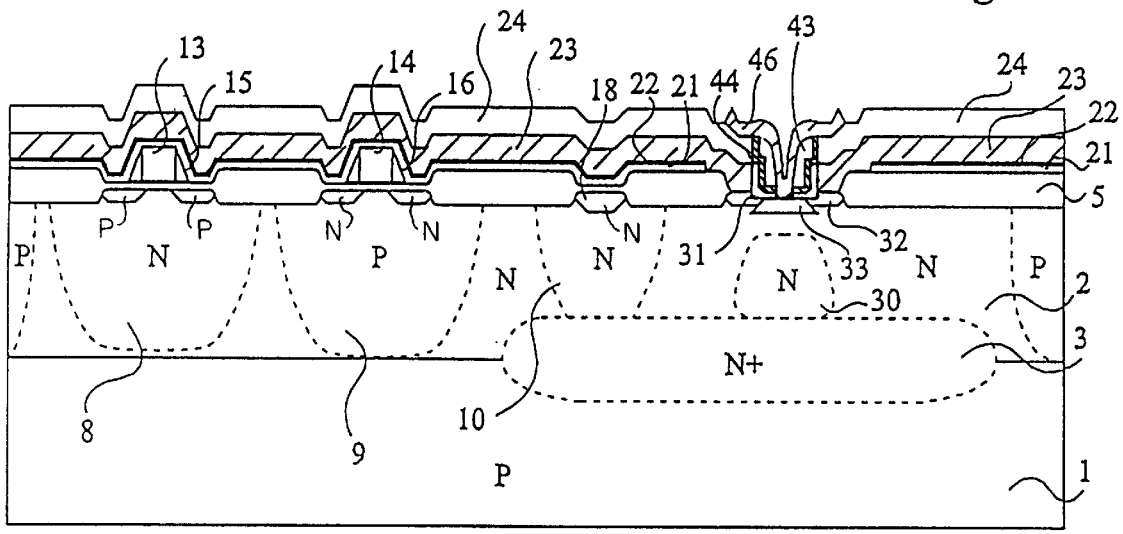

At the step illustrated in FIG. 8, thin oxide layer 31 at the bottom of the opening, which has been used as a protective layer during the emitter implantation (boron) and as an etching stop of the silicon nitride layer, is thoroughly cleaned, by example in a bath of diluted hydrofluoric acid. A heavily-doped N-type polysilicon layer is deposited, and then etched to leave in place a region 46. Regions of doped polysilicon layer 46 can be maintained in place at chosen locations to form, for example, capacitors between regions of this polysilicon 46 and regions of base polysilicon 23. At the step illustrated in FIG. 9, oxide layer 24 and base polysilicon layer 23 are removed outside the emitter-base region of the bipolar transistor and other possible regions including devices using portions of base polysilicon layer 23 (resistors, capacitors . . . ). Then, an encapsulation silicon oxide layer 47 is deposited.

After this, a penetration annealing of the doping contained in polysilicon layer 46 is performed at the center of the base region of the transistor to form its N-type emitter 49. The annealings associated with the bipolar transistor ensure an electric reactivation of the dopings and lead to junction depths of about 60 nm. The annealings are of the fast thermal anneal type and/or furnace anneal. The thermal processing (30 s, 1000° C.) is lighter than for the MOS transistors which are thus not affected.

Figure 10:
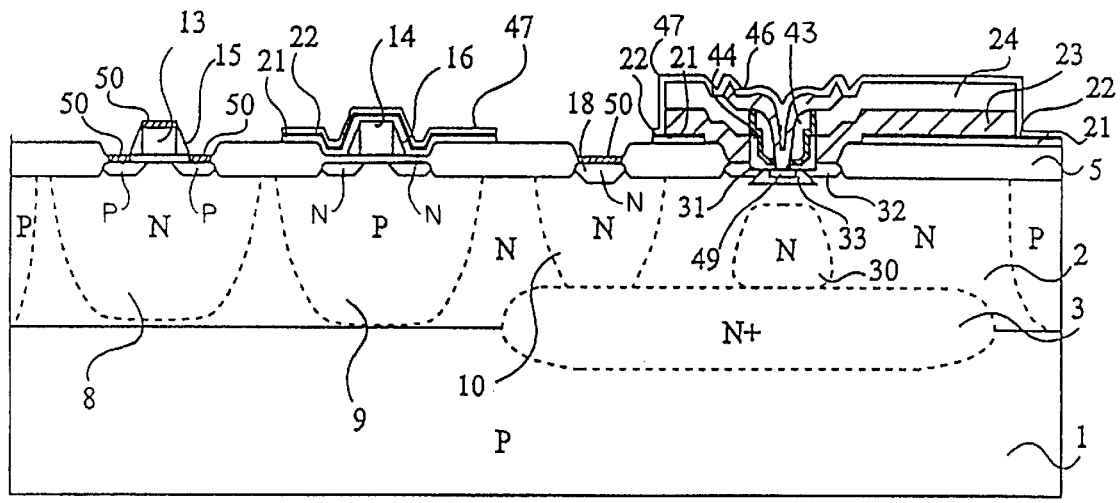

At the step illustrated in FIG. 10, silicon oxide encapsulation layer 47, silicon nitride layer 22, and protection silicon oxide 21 are removed above the active and/or polysilicon areas which are desired to be silicided, for example the P-channel MOS transistor and the collector well of the bipolar transistor. A metal silicide 50 is formed selectively above the exposed polysilicon and monosilicon regions.

Figure 11:
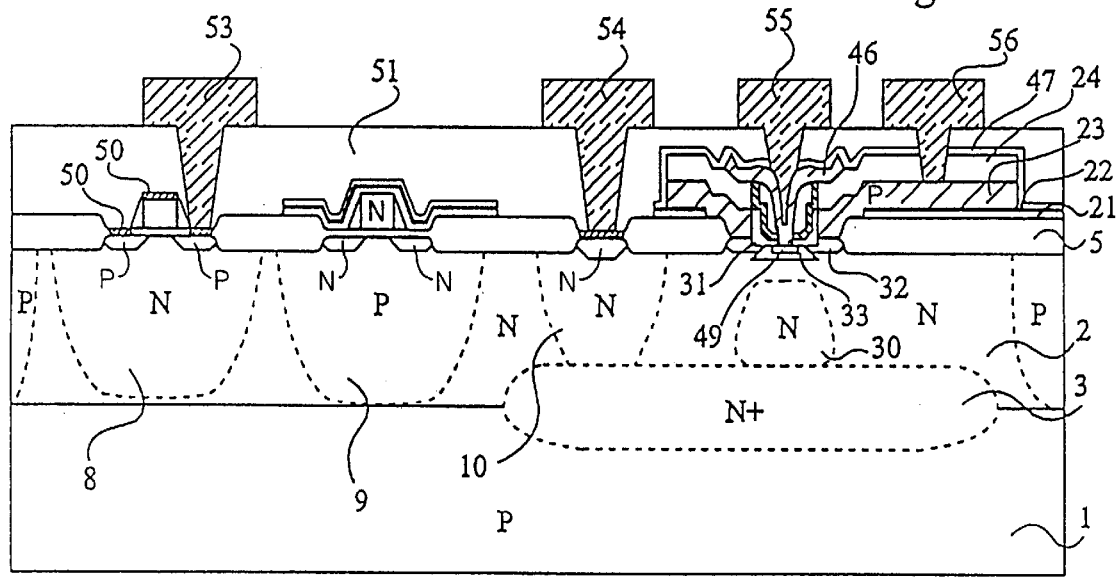

At the step illustrated in FIG. 11, a planarization isolating layer 51 is deposited by any known method, for example, by deposition of a boron and phosphorus doped glass (BPSG) layer and annealed, after which this layer and possible underlying layers are opened at the locations where contacts are desired to be made. Only some contacts have been shown since, as is well known, the contacts are not necessarily taken directly above the effective areas but possibly on crosswise extensions of conductive regions extending from these effective areas. Thus, in FIG. 11, only one drain contact 53 of a P-channel MOS transistor, one collector contact 54, one emitter contact 55 and one base contact 56 of the bipolar transistor have been shown.

Figure 12:
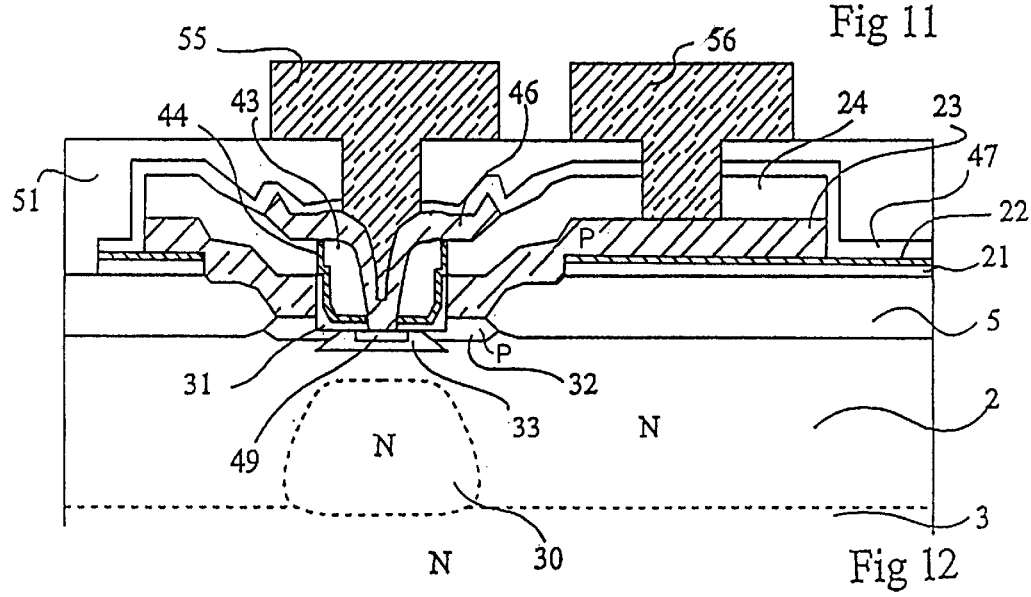
FIG. 12 is an enlarged view of an NPN-type bipolar transistor obtained by the method illustrated in FIGS. 1 to 11.

FIG. 12 corresponds to the bipolar side of FIG. 11 and shows the emitter-base region of the bipolar transistor at greater scale.

In a specific embodiment, and to give an example of orders of magnitude, the implementation of a structure with the following numerical data (where e designates a thickness, and Cs a superficial concentration or a mean concentration for a homogeneous layer) may be chosen:

substrate 1: $Cs=10^{15}$ at./cm$^3$, epi layer 2: $Cs=10^{16}$ at./cm$^3$, e=0.8 to 1.4 µm, buried layer 3: $Cs=10^{20}$ at./cm$^3$, oxide 5: e=0.5 µm, N or P sources and drains: $Cs=10^{20}$ at./cm$^3$, e=0.15 µm.

The above-described method of manufacturing, while entirely compatible with existing lines of manufacturing of high definition CMOS transistors, enables implementation of a bipolar transistor, the collector, intrinsic base, and emitter regions of which are self-aligned.

This bipolar transistor has many advantages. Its performance does not suffer from the presence of CMOS transistors. It can, in particular, be used at radiofrequencies (cut-off frequency higher than 40 GHz). The very high transconductance and the low noise of the bipolar transistor make it suitable for analog applications. In particular, the base contact (in P$^+$ polysilicon) enables an advantageous and large reduction of the base resistance, which results in an advantageous improvement in noise factor RF. Thus, the bipolar transistor can be used instead of some gallium arsenide transistors with a lower cost and the possibility of associating it on a same chip with a high performance CMOS circuit.

Generally, it is known that, to obtain optimal isolation of the several primary components of an integrated circuit, it is desirable to isolate these components by trenches filled with dielectric crossing the entire epitaxial layer of the integrated circuit. This is especially useful in c BICMOS type including, on the one hand, transistors operating at very high frequency and, on the other hand, analog circuits likely to be affected by parasitic carriers emitted by the high frequency transistors. Such circuits are encountered each time different functions are so mixed, for example in mobile telephony systems. However, in practice, this trench isolation is generally abandoned since it is extremely difficult to implement and thus the components likely to be subject to parasites are implemented in separated chips.

The present invention provides an embodiment of a trench isolation compatible with the previously described method of manufacturing of BICMOS integrated circuit. In particular, it will be shown that trenches can be made by this method without using any further steps with respect to the previously described steps. Further, the method described enables location of the trench very precisely by self-alignment from a previously described mask.

The initial steps of the method are those previously described in relation with FIGS. 1 to 3, that is, it is started at a fabrication step at which the MOS transistors are practically completed.

Figure 13:
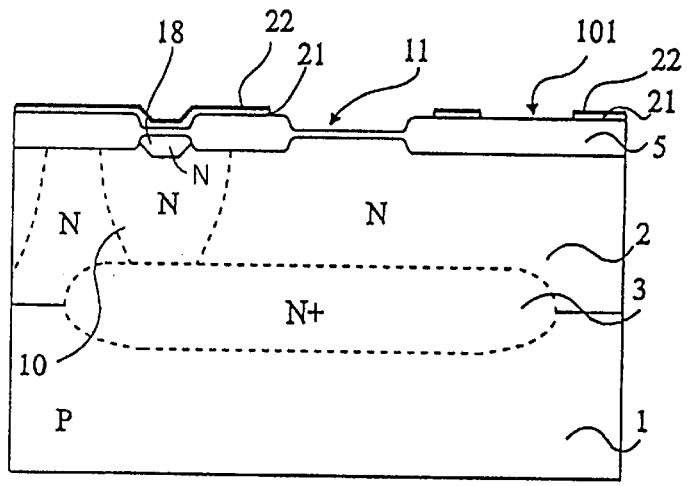
FIGS. 13 to 21 show steps of fabrication of an isolation trench according to the present invention.

FIG. 13 corresponds to previously described FIG. 4. In addition to the opening of the double silicon oxide and silicon nitride layer 21, 22, at the emitter-base locations of the bipolar transistors, an opening of this double layer is provided at locations 101 above thick oxide region 5.

Figure 14:
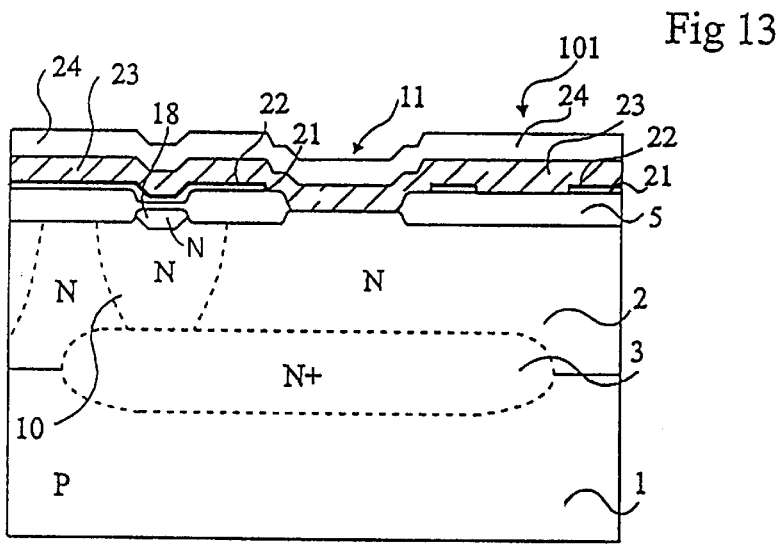

The step of FIG. 14 corresponds to that of FIG. 5, that is, a base polysilicon layer 23 of a thickness of, for example, 200 nm, and a silicon oxide layer 24 of a thickness of, for example, 300 nm, are successively deposited.

Figure 15:
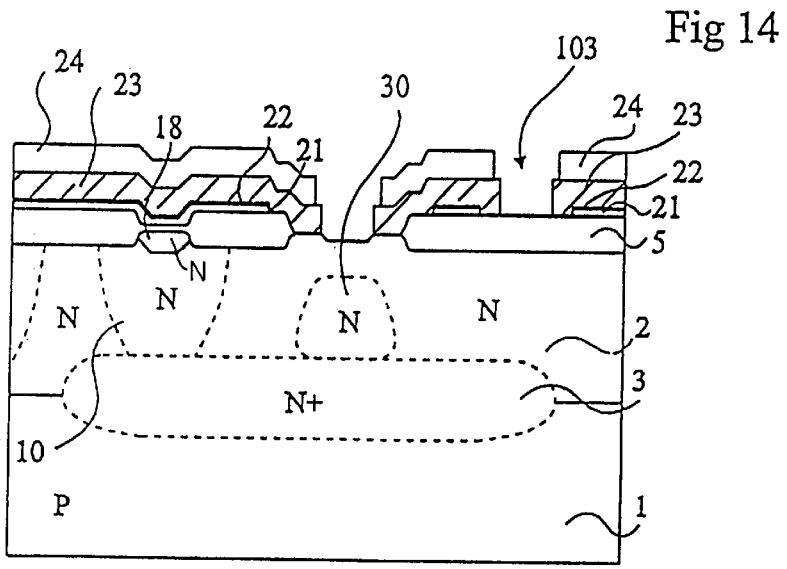

At the step illustrated in FIG. 15, which corresponds to FIG. 6, while layers 23, 24, are opened above the emitter-base regions, these layers are also opened above opening 101 so that opening 103 formed at the step of FIG. 15 is smaller than opening 101 formed at the step of FIG. 13. It will be seen that, at least in one embodiment of the present invention, this opening 103 determines the position and width of the trench to be formed. This position is thus defined with a great accuracy with respect to that of the other component of the integrated circuit. Indeed, the etching of layers 23 and 24 is a key step of the method previously described and the corresponding mask is defined and positioned with a high accuracy.

Figure 16:
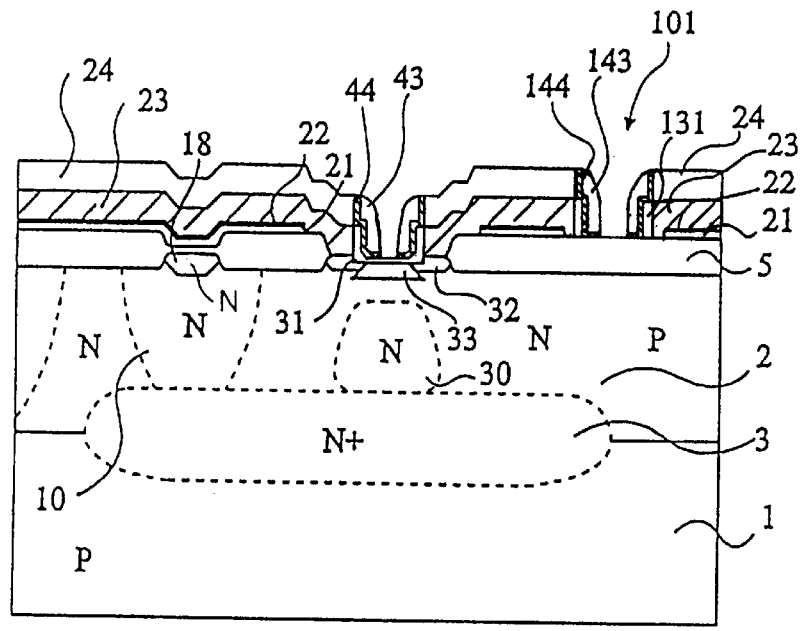

The step illustrated in FIG. 16 corresponds to that previously illustrated in FIG. 7. At this step, a thermal oxide layer 131 on the sides of polysilicon layer 23, and polysilicon spacers 143 enclosing a portion of nitride layer 144, are formed in opening 101.

At the step of FIG. 8, the successive steps of etching of thermal oxide 31 at the bottom of the emitter opening, of deposition of an emitter polysilicon layer 46, of removal by masking and etching of this emitter polysilicon area outside the useful areas had been described.

Figure 17:
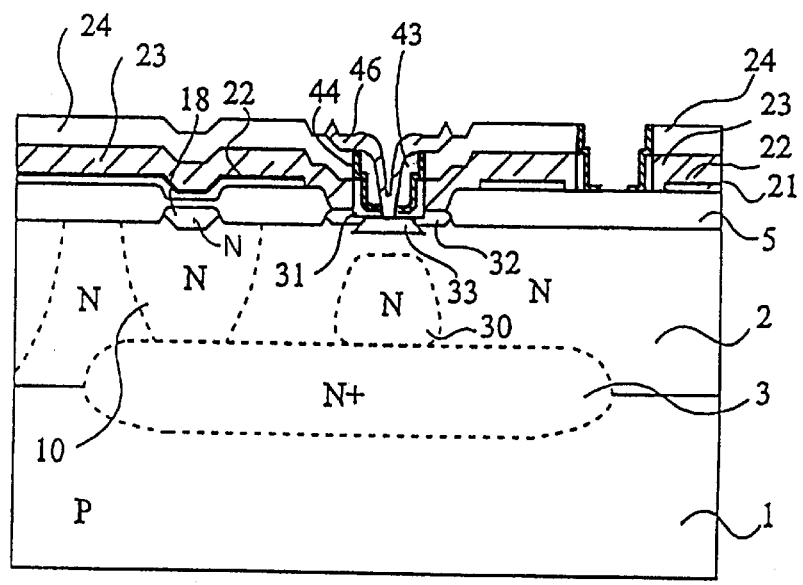

The same operations are repeated in area 103, as shown in FIG. 17. However, the etching is preferably prolonged to thoroughly etch silicon 46 and at the same time polysilicon spacers 143 in this area 103.

Figure 9:
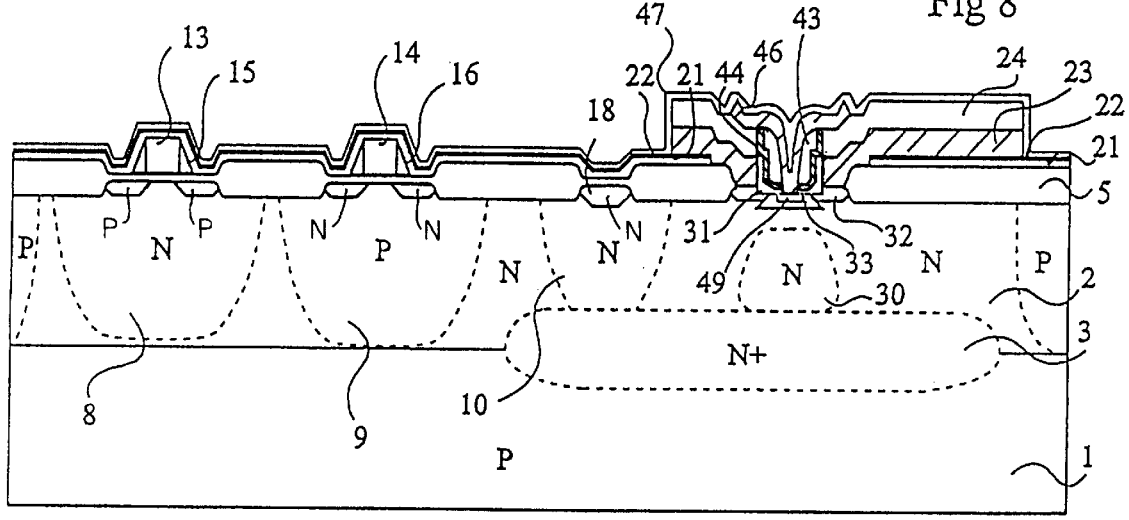

At the step described in relation with FIG. 9, the etching of protection oxide layer 24 and base polysilicon layer 23 had been performed outside a useful area. According to the present invention, as illustrated in FIG. 18, an opening 105 corresponding to opening 103 is opened in a resist layer used as a mask for this operation.

Opening 105 can be slightly smaller than opening 103 to define the dimension of the trench to be formed.

Figure 18:
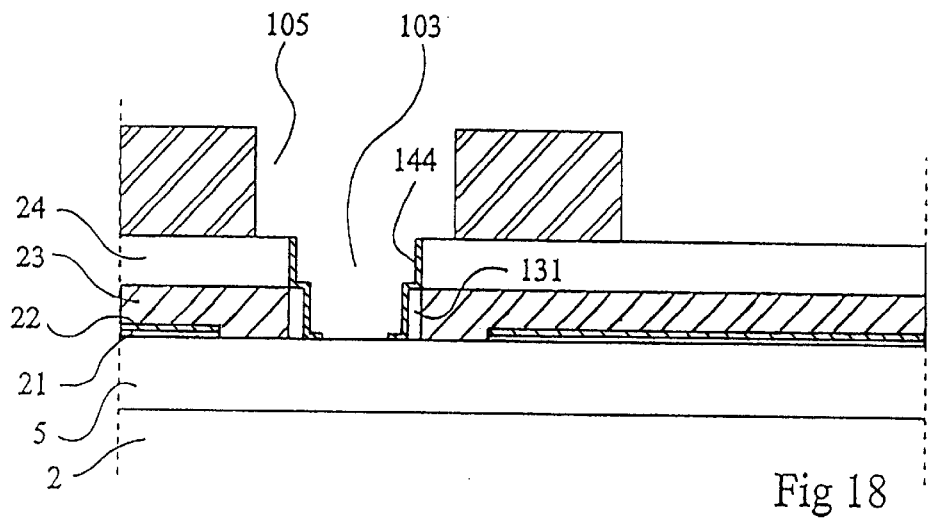

However, according to a preferred embodiment of the present invention, illustrated in FIG. 18, opening 105 extends beyond opening 103 which defines the dimension of the trench to be formed.

Figure 19:
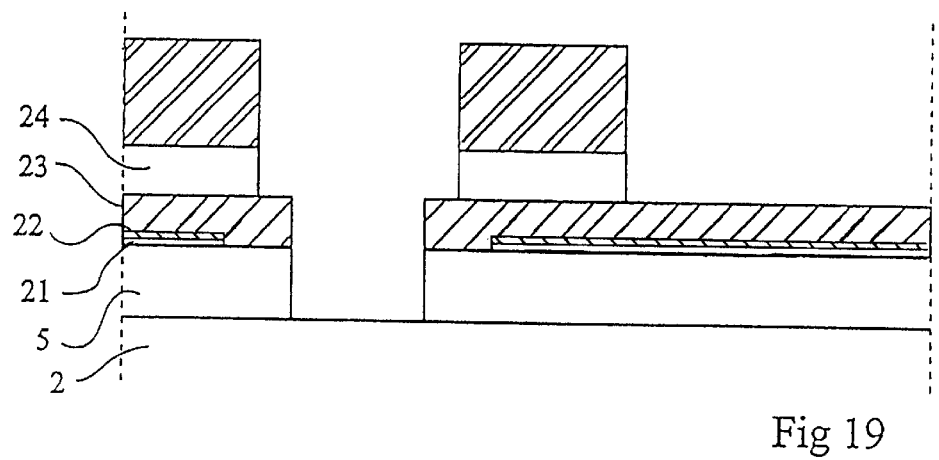

At a step, the result of which is illustrated in FIG. 19, an isotropic plasma etching of the silicon nitride is performed to remove nitride 144. Then, while protection layer 24 is being anisotropically etched, thick oxide layer 5 is etched under opening 103.

Figure 20:
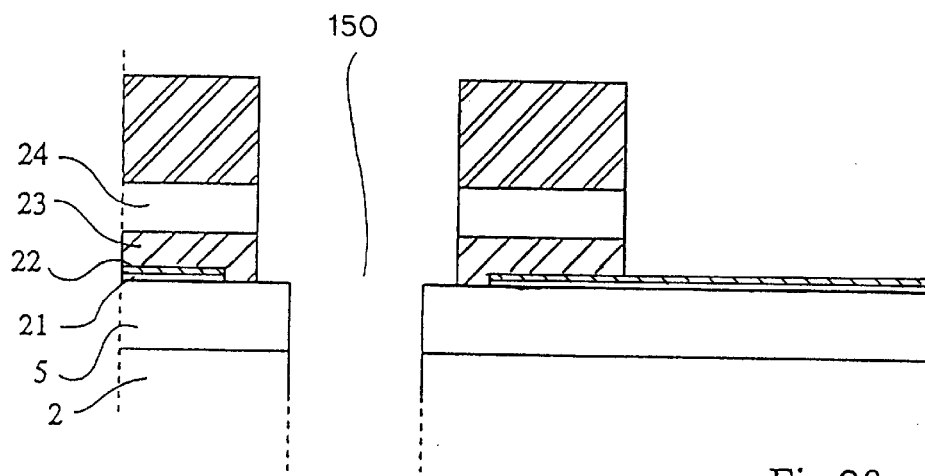

At a step, the result of which is illustrated in FIG. 20, while polysilicon layer 23 is being etched, epitaxial layer 2 formed on the silicon substrate is etched, until the interface between silicon substrate 1 and epitaxial layer 2 is reached. Thus, a deep isolating trench 150 of a depth of approximately 1 to 1.5 µm and of a width of approximately 0.25 to 0.5 µm or more is performed. The dimensions are chosen according to the desired result. For example, the trench can extend more deeply than the bottom of buried layer 3.

It should be noted that the above-mentioned anisotropic etchings of protection oxide layer 24 and of polysilicon layer 23 can be performed without particular difficulties. Indeed, those skilled in the art know methods of plasma etching ensuring a good etching selectivity between the silicon oxide and the silicon or the polysilicon. There is thus no difficulty in prolonging the etching of oxide layer 24 to etch the entire thickness of thick oxide layer 5. It should be recalled that this thick oxide layer has a thickness of about 0.5 µm while protection oxide layer 23 has a thickness of about 0.3 µm. Similarly, when polysilicon layer 23, of a thickness of about 0.2 µm, is etched, the epitaxial layer which has a thickness of about 1 µm (or more) can be easily etched simultaneously, given, additionally, that outside the area where the trench is formed, for the etching of polysilicon layer 23, there is a clear etch stop on the silicon nitride layers.

Figure 21:
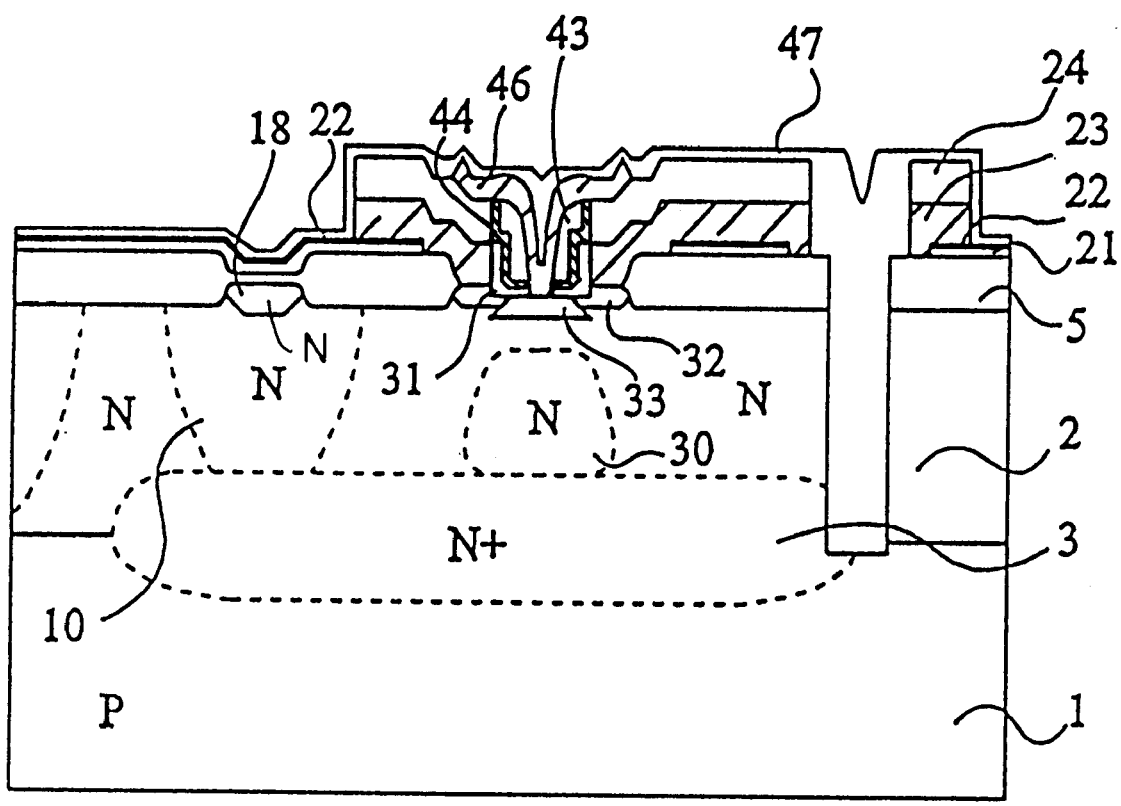

Deep trench 150 thus formed can then be filled with oxide during the deposition of protection silicon oxide layer 47 deposited by the conventional method, as shown in FIG. 21.

After the step illustrated in FIG. 21, the method continues with the steps previously described in relation with FIGS. 10 to 12, without any modification.

A deep trench has thus been formed in the epitaxial layer of the integrated circuit without adding any additional fabrication step with respect to those necessary to the formation of the previously described integrated circuit, the only modifications including a modification of the shapes of the masks and possibly of an isotropic silicon nitride etching step.

Those skilled in the art will notice that other components can be devised by using the line according to the present invention and that this line is likely to have many alterations, modifications and improvements. In particular, the several numerical values indicated have been given as an example only and each material indicated as an example may be replaced with another material performing the same function (for example, etching selectivity with respect to other materials). Further, various primary components can be implemented with or without a buried layer of one or the other type of conductivity.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of forming deep isolation trenches in a BICMOS-type integrated circuit wherein the formation of a bipolar transistor and an isolation trench includes the following steps:

depositing a base polysilicon layer;

depositing a protection oxide layer;

forming an emitter-base opening through the protection oxide layer and the base polysilicon layer and simultaneously forming an opening through the protection oxide layer and the base polysilicon layer above a thick oxide layer;

depositing an emitter polysilicon layer and etching this layer;

simultaneously etching the thick oxide layer and the protection oxide layer outside emitter and base areas of the bipolar transistor; and simultaneously etching a silicon layer under the thick oxide layer to define the isolation trench and etching the base polysilicon layer outside the emitter and base areas of the bipolar transistor.

2. The method of claim 1, wherein the smaller of masks for defining the trench is that which corresponds to the opening of the protection oxide and base polysilicon layers.

3. The method of claim 1, including, prior to opening of the protection oxide and base polysilicon layers, a step of removal of apparent silicon nitride layers.

4. The method of claim 1, wherein the trench is etched to a depth of about 1 to 1.5 $\mu$m.

5. The method of claim 4, wherein the trench has a width of approximately 0.25 to 0.50 $\mu$m.

6. A method of forming a BICMOS-type integrated circuit with isolation trenches, including forming an isolation trench and forming a bipolar transistor by simultaneously forming both an emitter opening and an isolation trench opening through a protection oxide layer and a base silicon layer; simultaneously etching a thick oxide layer and the protection oxide layer outside emitter and base areas of the bipolar transistor; and simultaneously etching epitaxial silicon under the thick oxide layer to form the isolation trench and etching the base silicon layer outside the emitter and base areas of the bipolar transistor.

7. The method of claim 6 wherein a location of the isolation trench is defined by self alignment.

8. The method of claim 6 wherein the formation of the isolation trench is compatible with a fabrication process of the bipolar transistor and CMOS structures of the integrated circuit.

9. The method of claim 6 wherein the isolation trench is etched to a depth of about 1 to 1.5 $\mu$m.

10. The method of claim 6 wherein the isolation trench is etched to a depth below a highly doped buried layer located below the bipolar transistor.

11. The method of claim 6 further including filling the trench with a dielectric.

12. The method of claim 6 wherein the base silicon layer is P-type doped polysilicon.

* * * * *